United States Patent [19]
Koifman et al.

[11] Patent Number: 5,724,038
[45] Date of Patent: Mar. 3, 1998

[54] NOISE CANCELLING CIRCUIT AND ARRANGEMENT

[75] Inventors: Vladimir Koifman, Rishon-Lezion; Yachin Afek, Kfar Saba; Sergio Liberman, Natania, all of Israel

[73] Assignee: Motorola, Inc., Schaumburg, Ill.

[21] Appl. No.: 599,742

[22] Filed: Feb. 12, 1996

[30] Foreign Application Priority Data

Feb. 10, 1995 [GB] United Kingdom ............... 9502586

[51] Int. Cl.⁶ .................................................. H03M 1/66
[52] U.S. Cl. ..................... 341/144; 341/143; 341/118
[58] Field of Search .................................. 341/118, 143, 341/144

[56] References Cited

U.S. PATENT DOCUMENTS

| | | | |
|---|---|---|---|
| 5,068,661 | 11/1991 | Kaneaki et al. | 341/143 |
| 5,235,334 | 8/1993 | Manvar et al. | 341/143 |
| 5,323,157 | 6/1994 | Ledzius et al. | 341/143 |
| 5,414,424 | 5/1995 | Cabler | 341/143 |
| 5,585,802 | 12/1996 | Cabler et al. | 341/144 |

*Primary Examiner*—Jeffrey A. Gaffin
*Assistant Examiner*—Jason L. W. Kost

[57] ABSTRACT

A noise cancelling circuit (10) is used with a D/A converter, the converter including a first modulator (11) and a data output. The circuit (10) has an error measuring arrangement (12, 13, 14) for measuring a quantization error signal of the modulator (11). A filter (19) receives the error signal and provides a filtered error signal. A filter compensator (17) is coupled to the data output and provides a compensated output. A scaler (15) is coupled to receive the filtered error signal and provides a scaled filtered error signal. A second modulator (16) is coupled to receive the scaled filtered error signal and provides a single bit stream of error data. A summing arrangement (18) sums the single bit stream of error data and the compensated output from the first modulator and provides a corrected output, such that the error signal is filtered, scaled and modulated and the data output is compensated such that the corrected output is obtained having a substantially reduced quantization error.

8 Claims, 3 Drawing Sheets

NOISE CANCELLING CIRCUIT AND ARRANGEMENT

FIELD OF THE INVENTION

This invention relates to noise cancelling circuits and particularly but not exclusively to noise cancelling circuits for use with D/A converters.

BACKGROUND OF THE INVENTION

In an oversampled digital to analogue (D/A) converter, such as a sigma-delta modulator, a digital input signal is to be converted to an analogue output signal. The input signal is first interpolated to produce an oversampled signal, which is modulated by a digital modulator to generate an N-bit signal. The digital modulator includes a quantizer and a number of integrators. The N-bit signal has a low-frequency component resembling the input signal and a "Quantization noise", which is mainly in a high-frequency band and is typically removed with a low pass filter.

A problem with this arrangement is that some quantization noise remains in the pass-band, and this noise is multiplied by sampling frequency.

Known methods to reduce this noise include taking a feedback error signal from input of the quantizer. However, this produces an increase of scale of the output signal and increases other associated device noise such as silicon noise and thermal noise.

This invention seeks to provide a noise cancelling circuit in which the above mentioned disadvantages are mitigated.

SUMMARY OF THE INVENTION

According to the present invention there is provided a noise cancelling circuit for use with a D/A converter having a sigma-delta modulator and a data output, the circuit including an input terminal for receiving an error signal of the sigma-delta modulator and error measuring means for measuring the error signal of the sigma-delta modulator. The error signal represents the quantization error of the modulator. Filtering means is coupled to receive the error signal from the error measuring means for providing a filtered error signal, filter compensating means is coupled to the data output of the D/A converter for providing a compensated output, scaling means is coupled to receive the filtered error signal for providing a scaled filtered error signal in dependence upon the filtered error signal. Modulating means is coupled to receive the scaled filtered error signal for providing a single bit stream of error data, summing means is provided for summing the single bit stream of error data and the compensated output from the D/A converter and for providing a corrected output. In this way the error signal is filtered, scaled and modulated and the data output is compensated such that the corrected output is obtained having a substantially reduced quantization error.

Preferably the error measuring means comprises a filter, a first delay arrangement and a subtraction arrangement. The compensating means preferably compensates for delay associated with the filtering means.

Preferably the compensating means is a second delay arrangement. The filtering means is preferably a comb filter.

Preferably the summing means comprises shift registers and switched capacitors.

According to a second aspect of the invention there is provided a noise cancelling arrangement comprising a plurality of noise cancelling circuits as described above, in cascaded configuration.

Preferably the compensating means of each circuit also compensates for the relative position of that circuit in the cascaded configuration.

In this way noise is reduced in the pass-band without producing an increase of scale of the output signal or increases in other associated device noise.

BRIEF DESCRIPTION OF THE DRAWINGS

A Digital to Analogue (D/A) converter in accordance with the present invention will now be described, by way of example, with reference to the accompanying drawings in which.

DETAILED DESCRIPTION OF A PREFERRED EMBODIMENT

Figure 1:
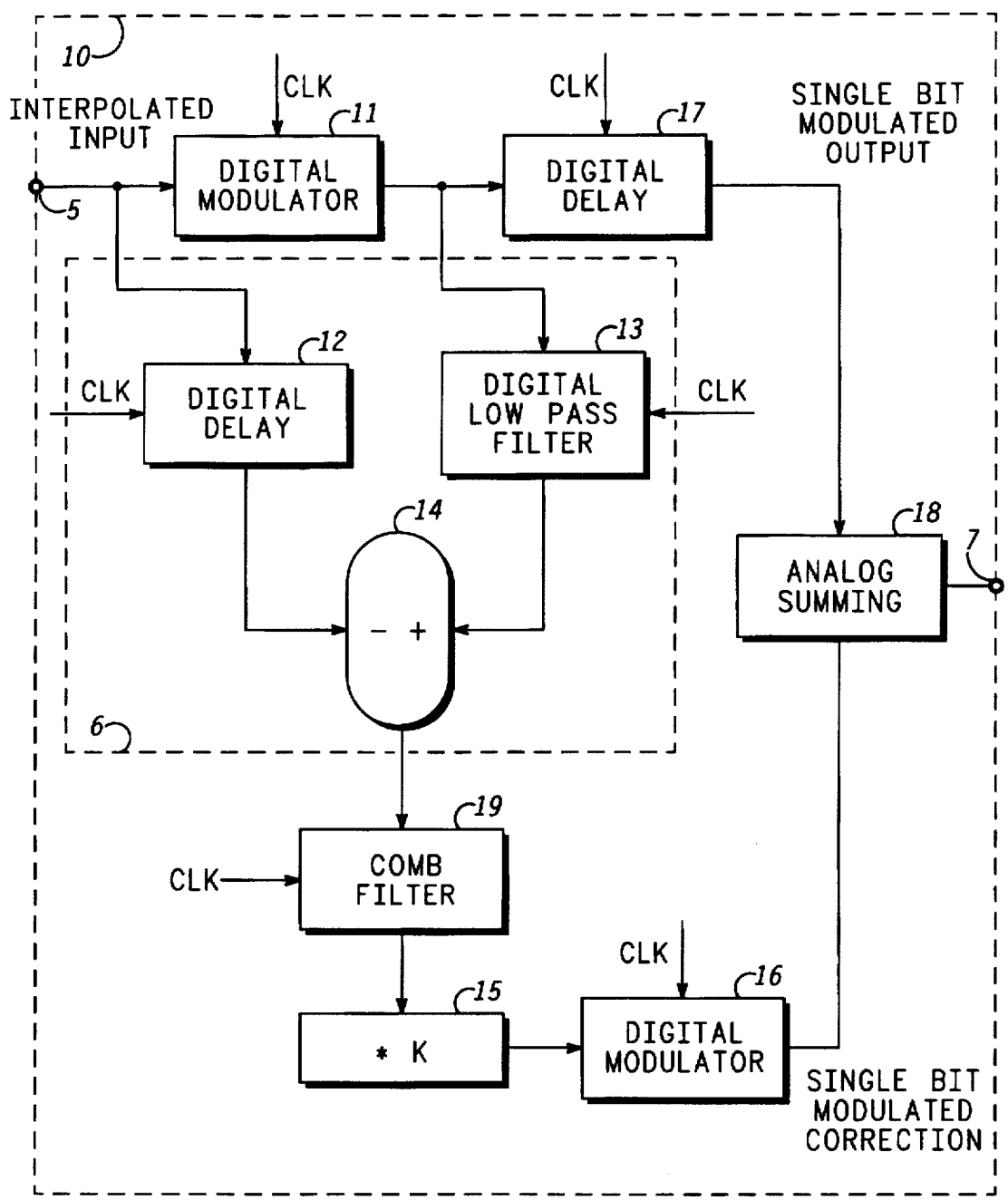
FIG. 1 shows a preferred embodiment of a noise cancelling circuit in accordance with the invention.

Referring to FIG. 1, there is shown a D/A circuit 10, comprising first and second digital modulators 11 and 16 respectively. The first digital modulator 11 has an input coupled to an input terminal 5 for receiving therefrom an interpolated input signal I1, and an output for providing a single bit stream output signal O1.

An error measuring arrangement 6 comprises a first digital delay block 12, also coupled to receive the interpolated input signal I1 from the input terminal 5 for providing a first delayed output signal, a (well known) digital LPF (low pass filter) 13 and a subtraction block 14. The digital LPF 13 is a finite impulse response filter, and is also coupled to receive the single bit stream output signal O1 from the first digital modulator 11, for providing a filtered output signal.

The subtraction block 14 is coupled to receive the first delayed output signal from the first digital delay block 12 and to receive the filtered output signal from the digital LPF 13, for subtracting the filtered output signal from the delayed output signal and for providing a subtracted output signal.

A second digital delay block 17 is coupled to receive the single bit stream output signal O1 from the first digital modulator 11 for providing a second delayed output signal.

An L-tap first order comb filter 19 is coupled to receive the subtracted output signal from the subtraction block 14, for providing a comb filtered output signal. A multiply block 15 is coupled to receive the comb filtered output signal from the comb filter 19, for providing a multiplied output signal which is the subtracted output signal multiplied by an integer K.

The second digital modulator 16 is coupled to receive the multiplied output signal from the multiply block 15, as an input signal I2, for providing a second modulated output signal O2 in dependence upon the input signal I2.

An analogue summing block 18 is coupled to receive the second delayed output signal from the second digital delay block 17, and the second modulated output signal from the second digital modulator 16, for providing an analogue summed output signal O3 to an output terminal 7.

A clock control input is coupled to the first and second digital modulators 11 and 16, the first and second delay blocks 17 and 12, the digital LPF 13 and the analogue summing block 18, for providing clocking signals to control the timing of the circuit 1.

In operation, at each clocking signal, the first digital modulator 11 generates a single bit output O1 which is an estimate of the interpolated input signal I1 in the base band frequencies, according to the following equation:

$$O1=I1+E1+E2$$

where E1 is unwanted noise within the baseband of the input signal I1, where E2 is unwanted noise outside of the baseband of the input signal I1.

At each clocking signal, the first digital delay block 12 generates a delayed interpolated input signal I1, the delay being defined by a parameter D, which determines a number of clocking signal occurrences for the delay.

Also at each clocking signal the first digital LPF 13 generates an output that is a low pass filter estimate of its first input I1. The characteristics that define the filtering function of the digital LPF 13 change for every instantiation of Digital LPF block.

The comb filter 19 generates a comb filtered output signal which is a comb filter of the input signal. The comb parameters are fixed and may vary at each instantiation.

The digital LPF 13 is designed such that LPF(I1+EI+E2) =delay(I1+E1); hence the filtered output signal=delay (I1+E1).

Hence the subtracted output signal=delay(I1)−delay(I1+E1); the two delays are designed to match each other, hence the subtracted output=−delay (E1).

It follows that the comb filtered output signal=comb(delay (K*E1)).

Also at each clocking signal, the second digital modulator 16 generates the O2 from the input signal I2 in a similar way to the first digital modulator 11, according to the following equation:

$$O2=I2+E1'+E2'$$

where E1' is a noise signal in the baseband of the input signal I2, where E2' is a noise signal out of the baseband of the input signal I2.

Therefore:

$$O2=-delay(comb(K*E1))+E1'+E2'.$$

The analogue summing block includes an analogue comb, and generates the analogue summed output signal O3 according to the following equation:

$$O3=comb(delay(O1))+(O2/K)$$

where K is a fixed integer. The parameters of the comb filter and K are fixed per an of the analogue summing block.

If the analogue comb of the analogue summing block 18 matches the comb function of the comb filter 19, and the delay of second digital delay block 17 matches the delay of the first digital delay block 13, it follows that:

$$O3=delay(comb(I1+E2))-(E2'/K)-(E1'/K)$$

The comb does not effect inband signals X and E1', hence:

As a result the inband noise (E1) is reduced by a factor K and the out of band noise (E2) is reduced by the comb filter action. The constant K is rather large and yields a large advantage in the inband noise.

All of this is achieved while maintaining the component matching insensitivity of digital modulators.

Figure 2:
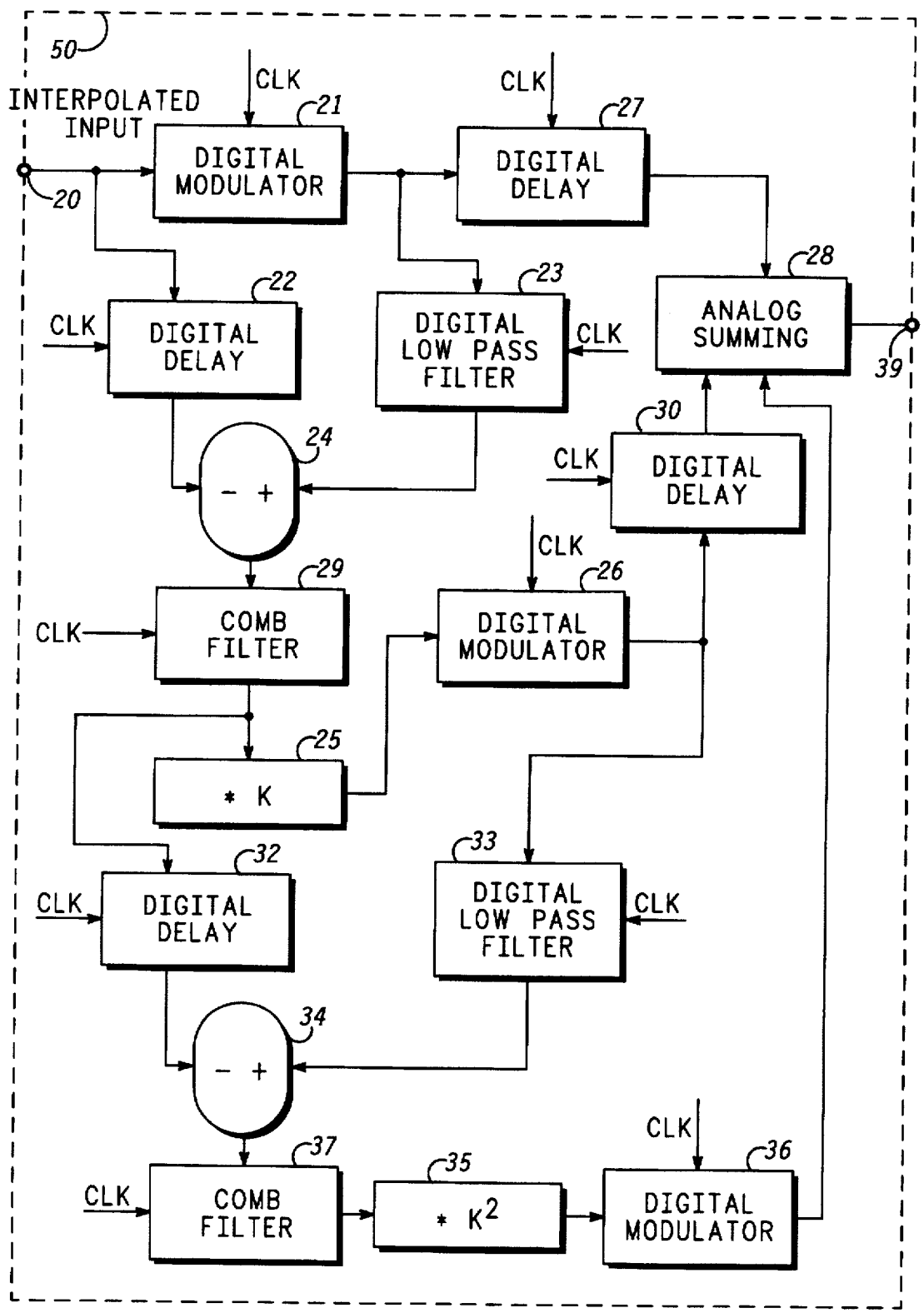
FIG. 2 shows a cascaded arrangement of three noise cancelling circuits of FIG. 1 with a shift register and comb filter arrangement.

Referring now to FIG. 2, a D/A circuit 50 is shown which employs two D/A circuits having similar components and arrangements to the circuit 10 of FIG. 1. The following elements are substantially identical to their counterparts in FIG. 1: First, second and third digital modulators 21, 26 and 36, first and second comb filters 29 and 37, first and second subtraction blocks 24 and 34, first and second multiply blocks 25 and 35, first, second, third and fourth digital delay blocks 22, 27, 32 and 37 and first and second digital LPFs 23 and 33.

The first digital modulator 21 of the D/A circuit 50 has an input coupled to receive an interpolated input signal from an input terminal 20 for receiving therefrom an interpolated input signal I1, and an output for providing a single bit stream output signal O1. The first and second digital delay blocks 22 and 27, the first digital LPF 23, the first subtraction block 24, the first comb filter 29 and the first multiply block 25 are all coupled and arranged as their counterparts in FIG. 1. The first digital delay block 27 provides a first delayed output signal S1 to the analogue summing block 28.

The output of the second digital modulator 26 is coupled to an input of the third digital delay block 30. The digital delay block 30 provides a third delayed output signal S2 to the analogue summing block 28.

The second digital LPF 33 is coupled to receive the modulated output from the second digital modulator 26, for providing a second filtered output signal.

A fourth digital delay block 32 is coupled to receive the comb filtered signal from the first comb filter 29, for providing a delayed output signal. The second subtraction block 34 is coupled to receive the third delayed output signal from the third digital delay block 32 and to receive the second filtered output signal from the second digital LPF 33, for subtracting the second filtered output signal from the delayed output signal and for providing a subtracted output signal.

The second comb filter 37 is coupled to receive the subtracted output signal from the subtraction block 34, for providing a comb filtered output signal. A multiply block 15 is coupled to receive the comb filtered output signal from the comb filter 19, for providing a multiplied output signal which is the subtracted output signal multiplied by an integer K.

The third digital modulator 36 is coupled to receive the multiplied output signal from the second multiply block 35, for providing a third modulated output signal S3 in dependence thereupon.

The analogue summing block 28 is coupled to receive the first delayed output signal S1 from the first digital delay block 27, the second modulated output signal S2 from the second digital modulator 26 and the third modulated output signal S3 from the third digital modulator 36, for providing a summed output signal to an output terminal 39.

The clock control input provides clocking signals to control the timing of the first, second and third digital modulators 21, 26 and 36, the first, second, third and fourth delay blocks 27, 22, 32, and 30, the first and second digital LPFs 23 and 33 and the analogue summing block 28.

Figure 3:
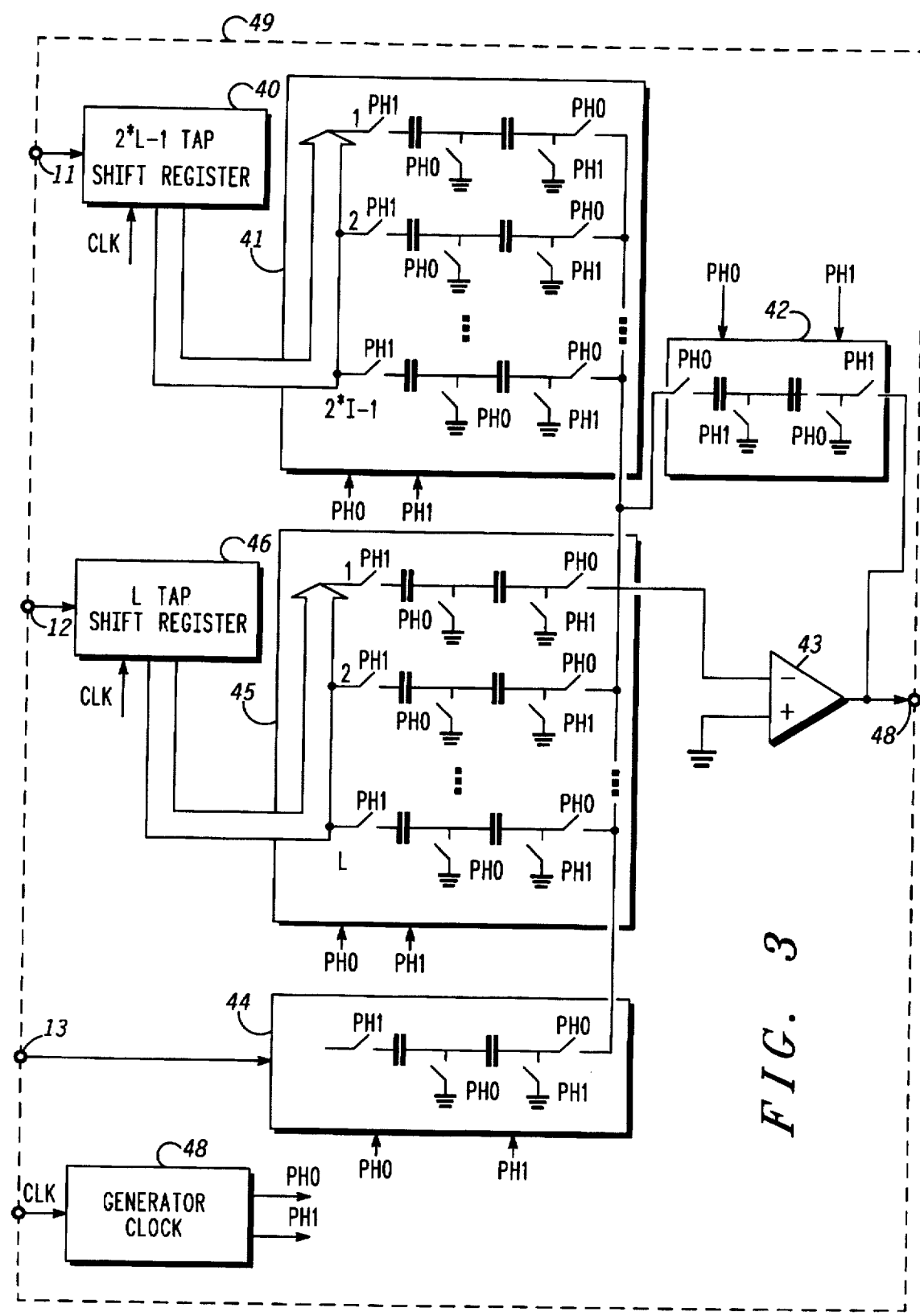
FIG. 3 shows in detail the shift register and comb filter arrangement of FIG. 2

Referring now to FIG. 3, the analogue summing block 28 of FIG. 2 is shown in greater detail. The first input S1 is coupled to a first shift register 40, which is a 2*L-1 tap shift register. The first shift register 40 provides a first output signal of 2*L-1 bits, in dependence upon the input signal S1.

Similarly, the second input S2 is coupled to a second shift register 46, which is an L tap shift register. The second shift register 46 provides a second output signal of 1 bit.

The third input S3 is coupled to a third switching circuit 44, to be further described below. The clock control input is coupled to a phase generator 48, and also to the first and second shift registers 40 and 46. The phase generator 48 provides first and second phase outputs PH0 and PH1, which are non-overlapping, in dependence upon the clocking control signals received via the clock control input.

A first switching circuit 41 is coupled to receive the first output signal from the first shift register 40, for providing a first switched output signal. A second switching circuit 45 is coupled to receive the second output signal from the second shift register 46, for providing a second switched output signal. The third switching circuit 44 is coupled to receive the third input signal S3, for providing a third switched output.

A fourth switching circuit 42 is coupled to receive a common input comprising the first, second and third switched output signals, for providing a fourth switched output signal.

An operational amplifier 43 has a non-inverting input connected to a ground terminal and an inverting input also coupled to receive the common input. An output of the operational amplifier is coupled to the output terminal; a clock generator circuit 48 who's first input clock couples to clock input.

The first, second, third and fourth switching circuits 41, 45, 44 and 42 each comprise internal switched capacitors and each is additionally coupled to receive the first and second phase signals PH0 and PH1 from the phase generator 48. In this way the inputs of the first, second, third and fourth switching circuits 41, 45, 44 and 42 are sampled onto the internal capacitors and the output signals are derived from the sum the charge stored on the capacitors.

The analogue summing block 18 of FIG. 1 generates the following output:

$$\text{Output}=\text{comb}(\text{comb}(S1))+\text{comb}(S2/K)$$

where K is a fixed integer.

By comparison, the analogue summing block 49 performs a double comb filtering operation on the first input S1: Comb(Comb(S1)); performs a comb filtering operation on the second input S2: Comb(S2); and sums the two comb filtering results with the third input S3 to generate an analogue output that equals:

$$\text{Output}=\text{comb}(\text{comb}(S1))+\text{comb}(S2/K)+S3/K^{**}2.$$

In a similar analysis to that performed for the analogue summing block 28 of FIG. 1, the output of the analogue summing block 49 is given by:

$$\text{Output}=\text{delay}(X)+E1''/K^{}2+\text{delay}(\text{comb}(\text{comb}(E2)))-\text{delay-}(\text{comb}(E2'/K))+E2''/K^{}2$$

where E1" and E2" are the noise parameters of the third digital modulator 36 and all other parameters are the equivalent parameters of FIG. 1. It follows that the inband noise is now reduced by $K^{**}2$ and the out of band noise is reduced by a double comb while maintaining the other features as explained in FIG. 1.

It will be appreciated by a person skilled in the art that alternate embodiments to the one described above are possible. For example, a circuit with a higher number of correction bits than those shown above can be similarly constructed. A circuit where not all LPF blocks are equal is similarly possible. Furthermore, a circuit where multiply constant of block 35 is not the square of that of block 25 is also possible.

We claim:

1. A noise cancelling circuit for use with a D/A converter having a sigma-delta modulator and a data output, the circuit comprising:

an input terminal for receiving an error signal of the sigma-delta modulator, error measuring means for measuring the error signal of the sigma-delta modulator, the error signal representing quantization error of the modulator, filtering means coupled to receive the error signal from the error measuring means for providing a filtered error signal, filter compensating means coupled to the data output of the D/A converter and for providing a compensated output, scaling means coupled to receive the filtered error signal, for providing a scaled filtered error signal in dependence upon the filtered error signal, modulating means coupled to receive the scaled filtered error signal for providing a single bit stream of error data, summing means for summing the single bit stream of error data and the compensated output from the D/A converter and for providing a corrected output, wherein the error signal is filtered, scaled and modulated and the data output is compensated such that the corrected output is obtained having a substantially reduced quantization error.

2. A noise cancelling arrangement comprising a plurality of noise cancelling circuit of claim 1, in cascaded configuration.

3. The noise cancelling arrangement of claim 2 wherein the compensating means of each circuit also compensates for the relative position of the circuit in the cascade.

4. The noise cancelling circuit of claim 1 wherein the error measuring means comprises a filter, a first delay arrangement and a subtraction arrangement.

5. The noise cancelling circuit of claim 1 wherein the compensating means compensates for delay associated with the filtering means.

6. The noise cancelling circuit of claim 1 wherein the compensating means is a second delay arrangement.

7. The noise cancelling circuit of claim 1 wherein the filtering means is a comb filter.

8. The noise cancelling circuit of claim wherein the summing means comprises shift registers and switched capacitors.

* * * * *

UNITED STATES PATENT AND TRADEMARK OFFICE
CERTIFICATE OF CORRECTION

PATENT NO. : 5,724,038
DATED : March 3, 1998
INVENTOR(S) : Vladimir Koifman et al.

It is certified that error appears in the above-identified patent and that said Letters Patent is hereby corrected as shown below:

In Abstract, line 6, after "provides a", delete "fired", replace with - - filtered- -.

In claim 8, column 6, line 54, after "claim", insert - -1- -.

Signed and Sealed this

Twenty-fourth Day of November, 1998

Attest:

BRUCE LEHMAN

Attesting Officer

Commissioner of Patents and Trademarks